(12) United States Patent
Leistiko et al.

(10) Patent No.: US 7,586,199 B1
(45) Date of Patent: Sep. 8, 2009

(54) STRUCTURES, ARCHITECTURES, SYSTEMS, METHODS, ALGORITHMS AND SOFTWARE FOR CONFIGURING AND INTEGRATED CIRCUIT FOR MULTIPLE PACKAGING TYPES

(75) Inventors: Tyson Leistiko, Sunnyvale, CA (US); Huahung Kao, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 470 days.

(21) Appl. No.: 11/372,865

(22) Filed: Mar. 9, 2006

Related U.S. Application Data

(60) Provisional application No. 60/664,924, filed on Mar. 23, 2005, provisional application No. 60/724,690, filed on Oct. 7, 2005, provisional application No. 60/729,107, filed on Oct. 21, 2005.

(51) Int. Cl.
*H01L 23/48* (2006.01)
*H01L 23/52* (2006.01)

(52) U.S. Cl. .................. 257/773; 257/786; 257/737; 257/E23.02

(58) Field of Classification Search .............. 257/737, 257/773, 786, E23.02
See application file for complete search history.

(56) References Cited

U.S. PATENT DOCUMENTS

| | | | |
|---|---|---|---|
| 5,707,894 A * | 1/1998 | Hsiao | 438/614 |
| 6,061,060 A * | 5/2000 | Berry et al. | 715/781 |
| 6,577,017 B1 * | 6/2003 | Wong | 257/786 |
| 7,034,402 B1 * | 4/2006 | Seshan | 257/781 |
| 7,098,540 B1 * | 8/2006 | Mohan et al. | 257/773 |
| 7,271,489 B2 * | 9/2007 | Lin et al. | 257/773 |
| 7,372,161 B2 * | 5/2008 | Lin et al. | 257/773 |
| 2003/0045026 A1 * | 3/2003 | Fogal et al. | 438/107 |
| 2003/0235926 A1 * | 12/2003 | Knollenberg et al. | 436/181 |
| 2006/0131748 A1 * | 6/2006 | Seshan | 257/737 |

* cited by examiner

*Primary Examiner*—Nitin Parekh

(57) ABSTRACT

Structures, architectures, systems, an integrated circuit, methods and software for configuring an integrated circuit for multiple packaging types and/or selecting one of a plurality of packaging types for an integrated circuit. The structure generally comprises a bump pad, a plurality of bond pads configured for independent electrical connection to the bump pad, and a plurality of conductive traces, each adapted to electrically connect one of the bond pads to the bump pad. The software is generally configured to place and route components of such a structure. The method of configuring generally includes the steps of forming the bump pad, the bond pads, and the conductive traces from an uppermost metal layer, and forming an insulation layer thereover. The method of selecting generally comprises the uppermost metal layer-forming step, and forming either (i) a wire bond to at least one of the bond pads, or (ii) a bumping metal configured to electrically connect at least one of the bond pads to the bump pad. The present invention advantageously provides reduced manufacturing costs and reduced inventory management issues by enabling one device to be manufactured at a wafer level for a plurality of different packaging options, thereby enabling packaging decisions to be made at a later time in the manufacturing process.

31 Claims, 11 Drawing Sheets

STRUCTURES, ARCHITECTURES, SYSTEMS, METHODS, ALGORITHMS AND SOFTWARE FOR CONFIGURING AND INTEGRATED CIRCUIT FOR MULTIPLE PACKAGING TYPES

RELATED APPLICATIONS

This application claims the benefit of U.S. Provisional Application No. 60/664,924, filed Mar. 23, 2005, U.S. Provisional Application No. 60/724,690, filed Oct. 7, 2005, and U.S. Provisional Application No. 60/729,107, filed Oct. 21, 2005, each of which is incorporated herein by reference in its entirety.

FIELD OF THE INVENTION

The present invention generally relates to the field of semiconductor and/or integrated circuit packaging. More specifically, embodiments of the present invention pertain to structures, methods, algorithms and software for configuring an integrated circuit for multiple packaging types and/or selecting one of a plurality of packaging types for an integrated circuit.

DISCUSSION OF THE BACKGROUND

Integrated circuits are widely available in a number of well-known packaging types, including wire-bonded lead packages (e.g., flat packs), ball grid arrays (BGAs; e.g., fine pitch BGAs). Frequently, manufacturers or suppliers of semiconductor and/or integrated circuit products (hereinafter, "integrated circuit(s)" or "ICs") may wish to provide ICs otherwise having the same functionality and density in different packaging types. However, in general, such functionally identical ICs having different packaging types have, at least in part, a different product number and a different manufacturing flow. Usually, this is due to a perceived need to use a different mask for the uppermost level of metallization in order to form connections between pads on the IC to structures (e.g., ball bonds or wire bonds) that communicate with external devices.

For example, FIG. 1 shows a top-down view of an IC 100 having bond pads 110*a*-110*z* configured for wire bonding. In such a configuration, the wire bonds often have a sufficient inductance due to their length and/or proximity to other wires to induce cross-talk in neighboring wires. The wires can also act as small antennae, and thus be inadvertently affected by signals on nearby wires or other external sources. As a result, it is a common practice in wire-bonded IC packages to use several wire bonds to carry a common signal. Typically, this practice is used for power and ground wires, where even small fluctuations in the level of the signal can have dramatic effects in IC functions.

On the other hand, FIG. 2 shows a functionally identical IC 200 having bump pads 210*a*-210*z* configured for ball bonding. As is readily apparent, the locations of bump pads 210*a*-210*z* are not, as a whole, identical to the locations of bond pads 110*a*-110*z* in the IC 100 of FIG. 1, even though the functional circuitry is generally identical between IC 100 and IC 200. Also, the balls (or bumps) that form ball bonds generally do not have an appreciable or significant inductance, so ball bonds generally do not have an appreciable function or action as an antenna. Thus, a single ball bond can carry a power supply or ground signal to a particular location in IC 200, as opposed to the multiple wire bonds used in IC 100 of FIG. 1. Thus, the connection requirements (e.g., input and/or output signals and/or the descriptions thereof) may differ with different packaging options.

As a result, traditionally, two (or more) different versions of ICs are created when different packaging types are desired. This adds the cost of at least one additional mask to produce the different packaging version of the device. It also complicates product inventory management, as the IC packaging decision has to be made at the beginning of wafer production. A need therefore exists to create a single design and/or layout that provides the ability to select one of a number of different packaging types, which will, in turn, reduce the number of masks in making a related family of products, reduce manufacturing costs, simplify product inventory management, and enable greater flexibility with regard to meeting market demands for products having a certain packaging type.

SUMMARY OF THE INVENTION

Embodiments of the present invention relate to structures, architectures, systems, methods, algorithms and software for configuring an integrated circuit for multiple packaging types and/or selecting one of a plurality of packaging types for an integrated circuit. The structure generally comprises (a) a bump pad; (b) a plurality of bond pads, each configured for independent electrical connection to the bump pad; and (c) a plurality of conductive traces, each trace adapted to electrically connect one of the bond pads to the bump pad. The architectures and/or systems generally comprise those that include a structure, circuit or layout embodying one or more of the inventive concepts disclosed herein.

The method of manufacturing or making the structure generally comprises the steps of (1) forming, from an uppermost metal layer on a device, a bump pad, a plurality of bond pads, and a plurality of conductive traces, each bond pad configured for independent electrical connection to the bump pad, and each trace adapted to electrically connect one of the bond pads to the bump pad; and (2) forming an insulation layer over the uppermost metal layer. The method of selecting a packaging option generally comprises the steps of (I) forming, from an uppermost metal layer on a device, a bump pad, a plurality of bond pads each configured for independent electrical connection to the bump pad, and a plurality of conductive traces each trace adapted to electrically connect one of the bond pads to the bump pad; and (II) forming either (i) a wire bond to at least one of the bond pads, or (ii) a bumping metal configured to electrically connect at least one of the bond pads to the bump pad. The algorithm, computer program(s) and/or software generally comprises a set of executable instructions configured to (a) place a bump pad and a plurality of bond pads in an upper metal layer, each such bond pad configured for independent electrical connection to the bump pad; and (b) route a plurality of conductive traces in the upper metal layer, each trace adapted to electrically connect one of the bond pads to the bump pad.

The present invention advantageously provides reduced manufacturing costs by using a common mask for the level of metal (typically the uppermost such level) forming pads in various packaging options. The present invention also reduces inventory management issues by enabling one device to be manufactured at a wafer level for a plurality of different packaging options, thereby enabling packaging decisions to be made at a later time in the manufacturing process (e.g., immediately prior to packaging).

These and other advantages of the present invention will become readily apparent from the detailed description of preferred embodiments below.

DETAILED DESCRIPTION OF THE PREFERRED EMBODIMENTS

Figure 1:
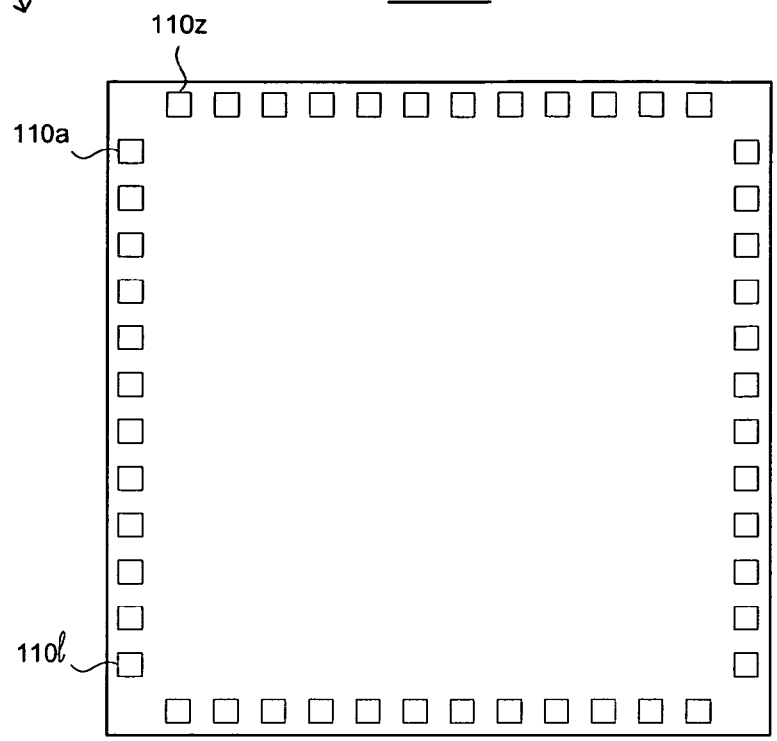
FIG. 1 is a diagram showing a top-down view of a conventional integrated circuit/semiconductor die configured for wire bonding.
Figure 2:
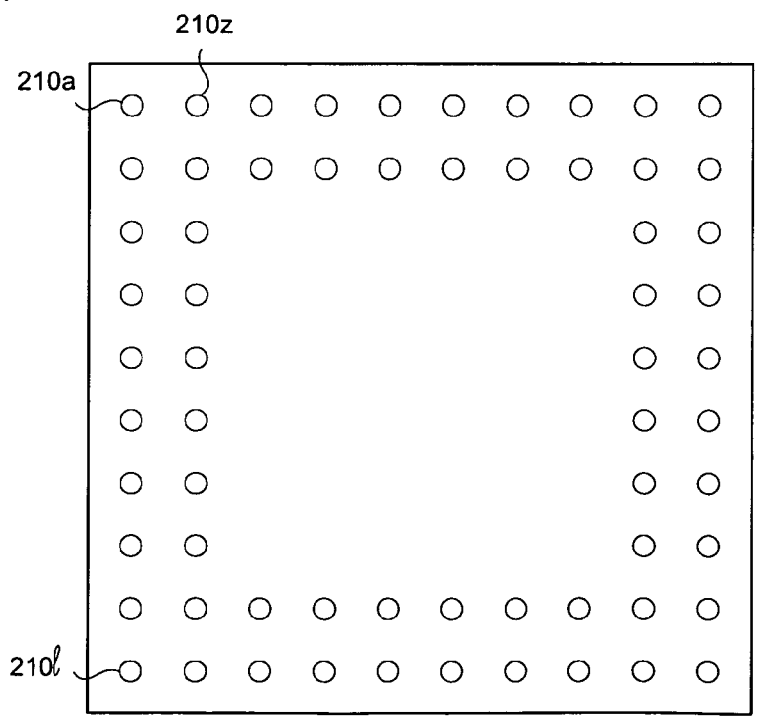
FIG. 2 is a diagram showing a top-down view of a conventional integrated circuit/semiconductor die configured for flip-chip ball bonding.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other representations of operations on electrical quantities, data, data streams or waveforms within a computer, processor, controller and/or electrical circuit. These descriptions and representations are generally used by those skilled in the electrical engineering and/or product engineering arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical and/or chemical manipulations of physical materials and/or quantities. Usually, though not necessarily, such quantities take the form of electrical, magnetic, or quantum signals capable of being stored, transferred, combined, compared, and otherwise manipulated in a computer, data processing system, or circuit. It has proven convenient at times, principally for reasons of common usage, to refer to these signals as bits, waves, waveforms, streams, values, elements, symbols, characters, terms, numbers, or the like. It should be borne in mind, however, that all of these and similar terms are associated with the appropriate physical quantities and are merely convenient labels applied to these quantities.

Unless specifically stated otherwise and/or as is apparent from the following discussions, throughout the present application, discussions utilizing terms such as "processing," "operating," "determining," "manipulating," or the like, refer to the action and processes of a controlled apparatus (generally a computer-controlled apparatus), processing system, circuit or similar processing device (e.g., a semiconductor manufacturing or packaging apparatus), that deposits, removes, manipulates and/or transforms materials or other physical structures on a substrate. Furthermore, for the sake of convenience and simplicity, the terms "solder bump" and/or "solder ball" are generally used interchangeably herein and are generally given their art-recognized meanings, but the use of one such term herein generally includes the other term. Also, for convenience and simplicity, the terms "data," "data stream," "waveform" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings.

The present invention concerns structures, architectures, methods, algorithm(s) and software for configuring multiple packaging options on a single IC or semiconductor die, and/or selecting one of a plurality of packaging types for an integrated circuit. The structure generally comprises (a) a bump pad; (b) a plurality of bond pads, each configured for independent electrical connection to the bump pad; and (c) a plurality of conductive traces, each trace adapted to electrically connect one of the bond pads to the bump pad. The architecture (including any integrated circuit employing such an architecture) generally comprises the present structure and/or any structure, circuit or layout embodying the inventive concepts described herein.

A further aspect of the invention concerns methods of making a structure configured for multiple packaging options and a method of selecting one of a plurality of packaging options on such a structure (or on an integrated circuit containing such a structure). The method of making generally comprises (1) forming, from an uppermost metal layer on a device, a bump pad, a plurality of bond pads, and a plurality of conductive traces, each bond pad configured for independent electrical connection to the bump pad, and each trace adapted to electrically connect one of the bond pads to the bump pad; and (2) forming an insulation layer over the uppermost metal layer. The method of selecting a packaging option generally comprises the steps of (I) forming, from an uppermost metal layer on a device, a bump pad, a plurality of bond pads each configured for independent electrical connection to the bump pad, and a plurality of conductive traces each trace adapted to electrically connect one of the bond pads to the bump pad; and (II) forming either (i) a wire bond to at least one of the bond pads, or (ii) a bumping metal configured to electrically connect at least one of the bond pads to the bump pad. The algorithm, computer program(s) and/or software generally comprises a set of executable instructions configured to (a) place a bump pad and a plurality of bond pads in an upper metal layer, each such bond pad configured for independent electrical connection to the bump pad; and (b) route a plurality of conductive traces in the upper metal layer, each trace adapted to electrically connect one of the bond pads to the bump pad, and/or otherwise implement one of the present methods or execute any process or sequence of steps embodying the inventive concepts described herein.

The invention, in its various aspects, will be explained in greater detail below with regard to exemplary embodiments.

Exemplary Structures, Architectures and/or Layouts

In one aspect, the present invention relates to a structure, comprising (a) a bump pad; (b) a plurality of bond pads, each configured for independent electrical connection to the bump pad; and (c) a plurality of conductive traces, each trace adapted to electrically connect one of the bond pads to the bump pad. Alternatively, the structure may comprise (a) means for attaching a solder ball to an integrated circuit; (b) a plurality of means for attaching a wire bond to the integrated circuit, each wire bond attaching means being configured for independent electrical connection to the means for attaching a solder bump or solder ball; and (c) a plurality of means for electrically connecting one of the a plurality of means for attaching a wire bond to the means for attaching a solder bump or solder ball. If the bump pad and the bond pad(s) are not connected electrically, an IC containing the structure remains configured for wire bond packaging. By electrically connecting the bump pad to one or more of the bond pads, an IC may be configured for ball bond packaging. Thus, the present invention provides a structure for enabling multiple packaging options in a single design, layout and/or mask set (not including a pad opening mask; for the purposes of this invention, forming openings in an uppermost dielectric or passivation layer of an IC to expose the pads is considered part of the packaging process).

In general, the structure comprises a disconnection in the bump pad and/or each of the plurality of conductive traces. In one embodiment (e.g., discussed below with regard to FIGS. 3-5C), the bump pad comprises a plurality of bump pad sections, the disconnection being between at least two of the bump pad sections. In an alternative embodiment, (e.g., discussed below with regard to FIGS. 7A-7B), each of the plurality of conductive traces comprises a plurality of trace sections having the disconnection therebetween. In a preferred implementation, regardless of where the disconnection is located, an electrical connection comprising a bumping metal layer may be formed on or over the location of the disconnection (e.g., on the bump pad sections and/or one or more of the plurality of conductive traces).

Figure 3:
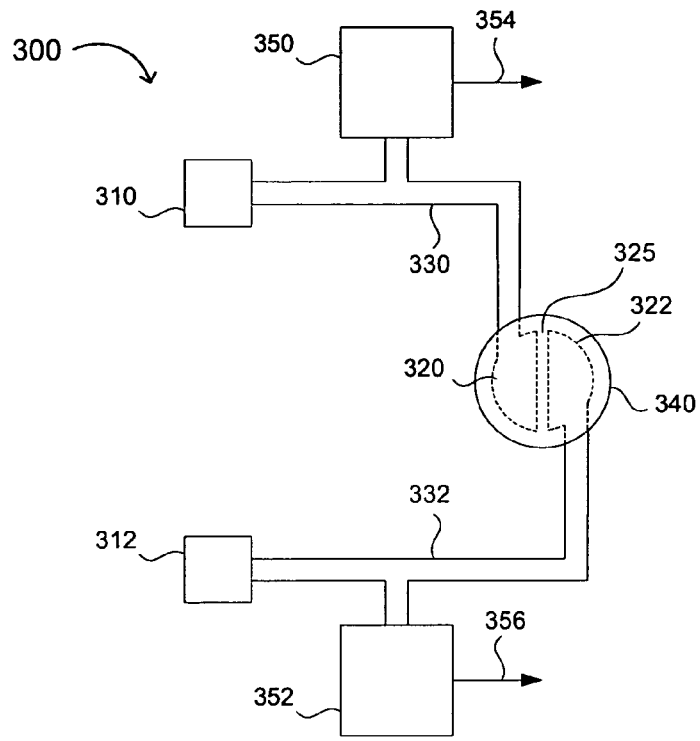
FIG. 3 is a diagram showing a top-down view of a first embodiment of the present invention.

FIG. 3 shows an exemplary structure 300 comprising a bumping metal layer 340 on and/or over the bump pad region generally defined by bump pad sections 320-322 (and designated, at least in part, by dashed lines). A bump pad region is a location on the IC where a solder bump or solder ball (also referred to herein as a "ball bond") may be subsequently formed. Thus, the present structure may further comprise a solder bump or solder ball on or over the bump pad. In this case, because the bump pad region and the bond pads are on the same surface of the IC, the bump pads are generally configured for flip-chip ball bonding. In addition, structure 300 generally comprises a plurality of bond pads 310 and 312, each having a conductive trace (330 and 332, respectively) electrically connecting it to one of bump pad sections 320 or 322, respectively. The bump pad sections 320 and 322 have disconnection 325 therebetween.

As is conventional in the art, exemplary structure 300 may further contain conventional input and/or output circuits 350 and 352. Each input/output circuit 350 and 352 is in electrical communication with one of the bond pads (310 and 312, respectively), via a conductive trace (330 and 332, respectively). Typically, input/output circuits 350 and 352 are placed (or laid out) in relatively close proximity to bond pads 310 and 312. Depending on the exact placement of the bump pad region 320-322, input/output circuits 350 and 352 may or may not be placed in close proximity thereto. Typically, input/output circuits 350 and 352 are farther away from the bump pad region 320-322 than from bond pads 310 and 312. As a result, it may be an advantageous design choice to locate an electrical disconnection in, or relatively close to, the bump pad region 320-322 (e.g., disconnection 325).

When input/output circuits 350 and 352 are configured as input and/or input/output buffers, they may provide an input signal (354 and 356, respectively) to the internal devices and/or circuitry of the IC. Additionally or alternatively, input/output circuits 350 and 352 may further include or be configured as circuit protection devices, in which case each of the bond pads 310 and 312 may be in electrical communication with at least one of the circuit protection devices (e.g., 350 and 352, respectively). In one alternative (not shown in FIG. 3), a single circuit protection device can be in electrical communication with more than one (e.g., adjacent) bond pads. Thus, when a wire bond is subsequently formed to a bond pad (e.g., bond pad 310), the signal carried on the wire bond is automatically in communication with input/output circuit 350.

Figure 4:
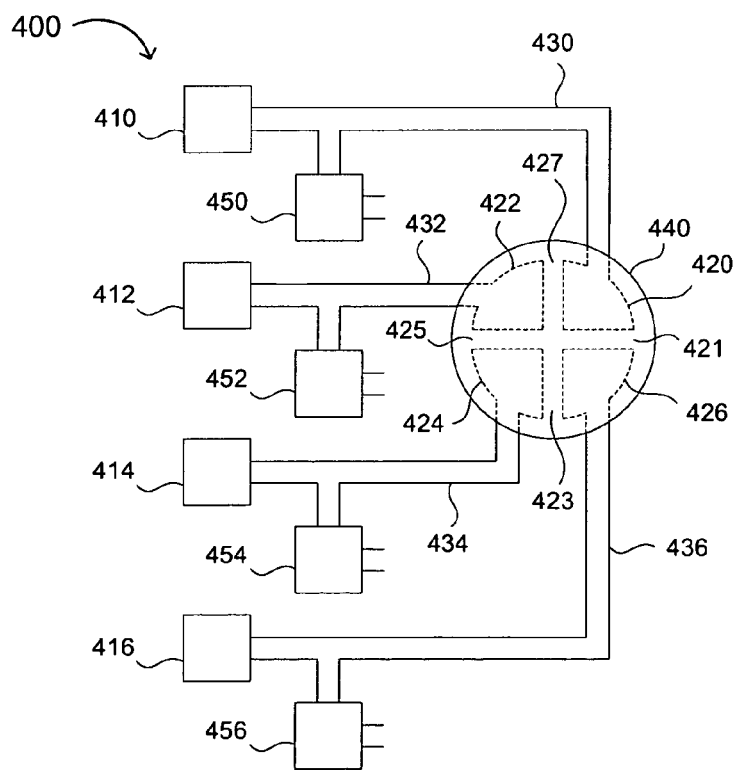
FIG. 4 is a diagram showing a top-down view of a second embodiment of the present invention.

FIG. 4 shows a second exemplary structure 400, comprising a bumping metal layer 440 on and/or over the bump pad region generally defined by bump pad sections 420, 422, 424 and 426 (and designated, at least in part, by dashed lines). In addition, structure 400 generally comprises a plurality of bond pads 410, 412, 414 and 416, each having a conductive trace (430, 432, 434 and 436, respectively) electrically connecting it to one of bump pad sections 420, 422, 424 and 426, respectively. The bump pad sections 420, 422, 424 and 426 have disconnection(s) 421, 423, 425 and 427 therebetween. Thus, the bump pad region may contain 2, 3, 4, or more bump pad sections, essentially up to the limit of such sections to which conductive traces can be formed, and over or on which a ball bond can be formed. Similar to the exemplary structure 300 in FIG. 3, exemplary structure 400 (FIG. 4) may further contain conventional input and/or output circuits 450, 452, 454 and 456. Each input/output circuit 450, 452, 454 and 456 is in electrical communication with one of the bond pads (410, 412, 414 and 416, respectively), via a conductive trace (430, 432, 434 and 436, respectively).

As shown in FIGS. 3 and 4, the size, area or diameter of the bump region can vary, depending on the number of bump pad sections and the size (or pitch) of the ball bond formed thereon. For example, assuming bond pads 310-312 in FIG. 3 have substantially the same dimensions as bond pads 410-416 in FIG. 4, the bump pad region in FIG. 4 may have dimensions suitable for ball grid array (BGA) packaging, and the bump pad region in FIG. 3 may have dimensions suitable for fine pitch ball grid array (FPBGA) packaging. In fact, it is possible in the present invention to configure the structure for three or more packaging options (e.g., wire bonds and 2 or more ball bonds having different dimensions). In such a case, the different bump pad regions may overlap and/or be placed in different (e.g., separate or exclusive) locations.

Figure 5A:
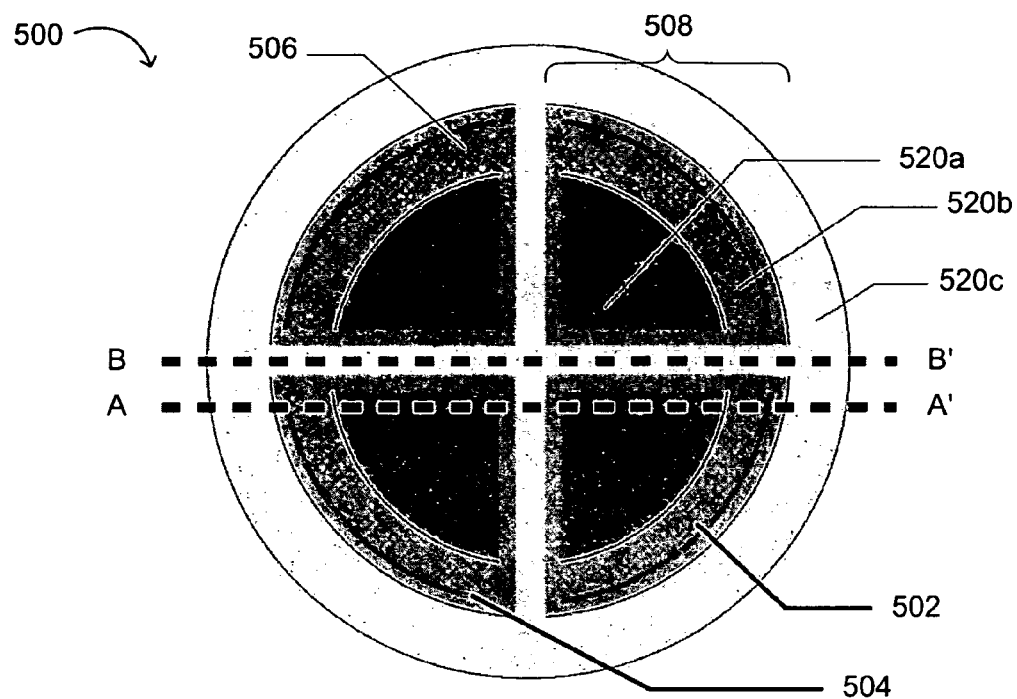
FIG. 5A is a top-down view of an embodiment of a bump pad according to the present invention.
Figure 5B:
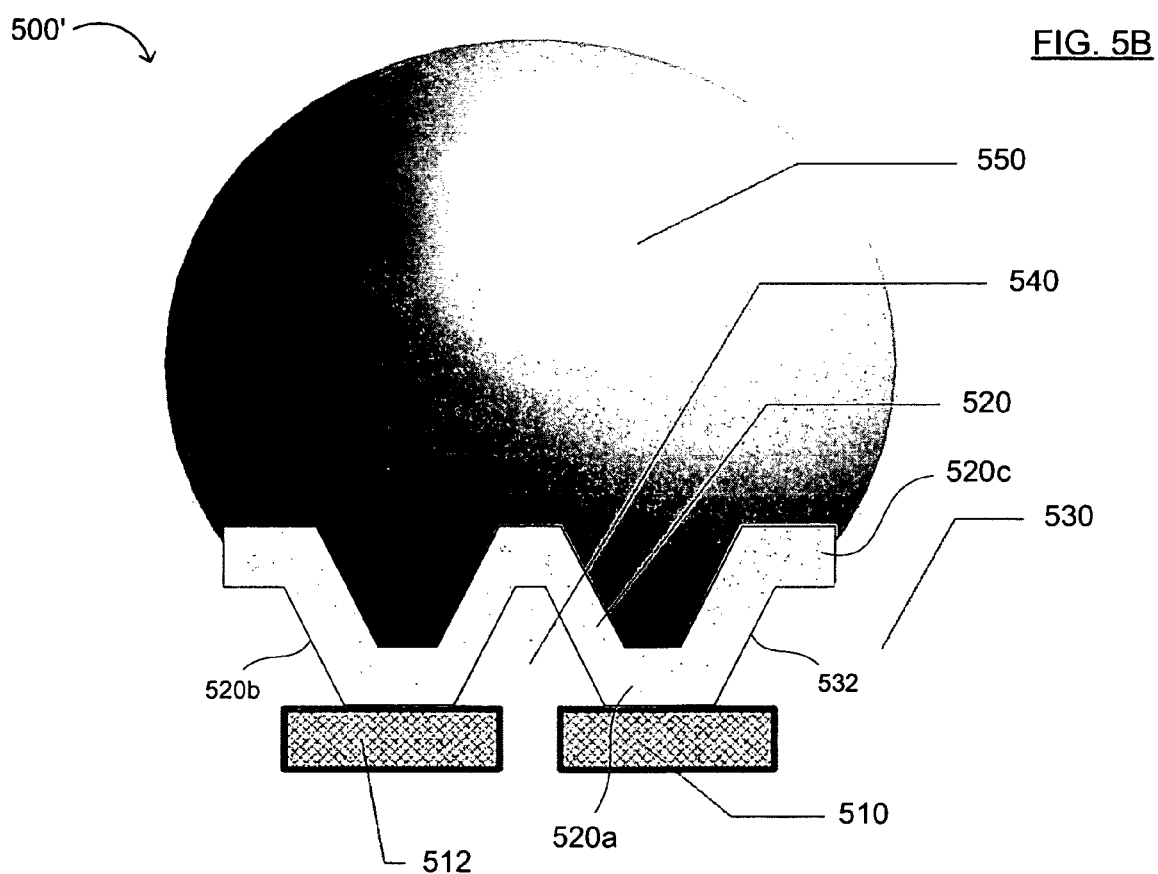
FIGS. 5B-5C show cross-sectional views of the bump pad of FIG. 5A along lines A-A' and B-B', respectively, with a ball bond formed thereon.
Figure 5C:
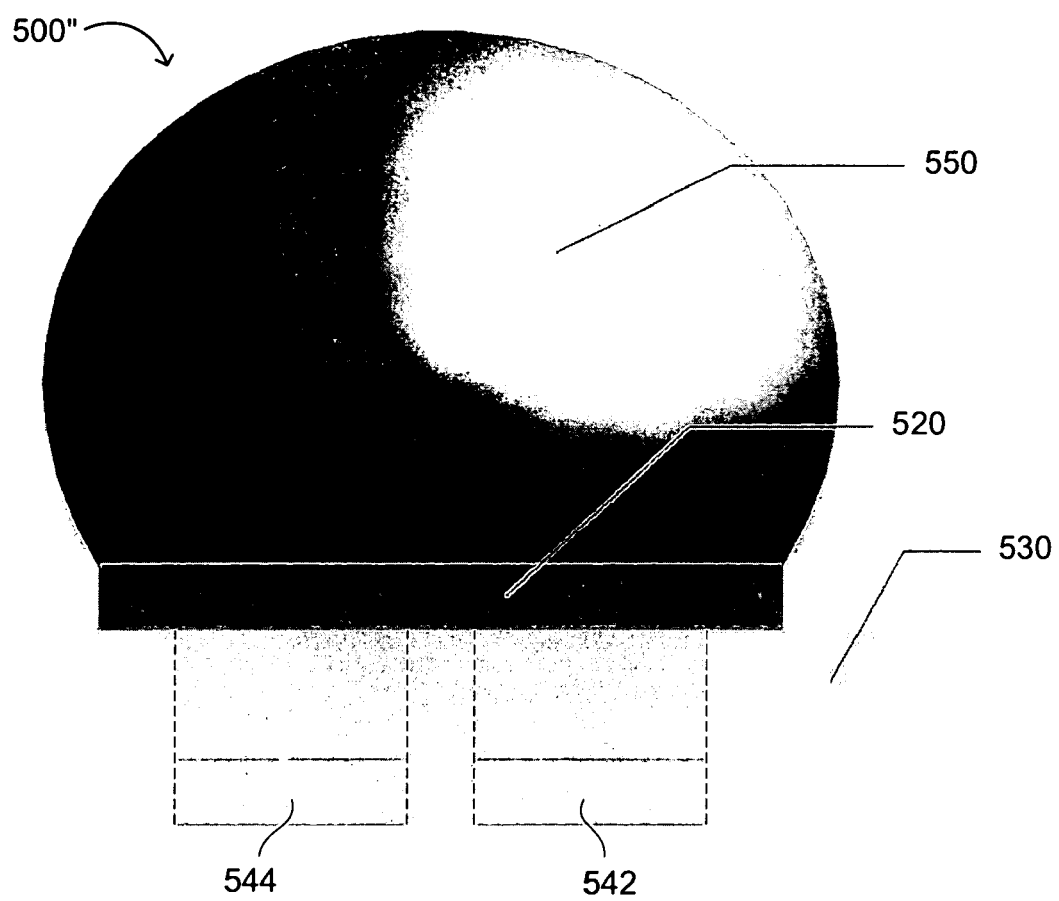

FIG. 5A is a top-down view of the bump pad region of the present structure, and FIGS. 5B-5C show cross-sections of the bump pad region of FIG. 5A having a ball bond thereon, along the A-A' axis and B-B' axis, respectively. For example, referring to FIG. 5A, bump pad region 500 comprises bumping metal layer 520a-c, covering first bump pad section 502, second bump pad section 504, third bump pad section 506, and fourth bump pad section 508. Although generally only the bumping metal layer 520a-c is exposed in the upper surface of bump pad region 500, the bumping metal layer 520a-c may contain different portions or sections, depending on the substructure under the bumping metal layer. For example, first bumping metal layer portion 520a may be in direct contact with an underlying bump pad section (e.g., 510 in FIG. 5B), second bumping metal layer portion 520b may be in contact with a sidewall of an opening in an underlying insulation or passivation layer (e.g., 532 in FIG. 5B), and third bumping metal layer portion 520c may be in contact with an upper surface of the underlying insulation or passivation layer (e.g., 534 in FIG. 5B).

FIG. 5B shows a cross-sectional view of the bump pad region 500 of FIG. 5A along the A-A' axis, but further comprising a ball bond 550 thereon. Bump pad/ball bond region 500' (FIG. 5B) shows a first bump pad section 510, second bump pad section 512, bumping metal layer 520, passivation or insulation layer 530, disconnection 540, and ball bond (or solder bump) 550. First and second bump pad sections 510 and 512 generally comprise the same layer of metal in the IC or semiconductor chip (e.g., the uppermost layer of metal). Such metal may comprise copper or aluminum. Disconnection 540 electrically isolates first bump pad section 510 from second bump pad section 512. Insulation layer 530 and disconnection 540 generally comprise the outermost layer of insulation, and may comprise or be selected from silicon oxide, silicon nitride, silicon oxynitride, or a laminate or combination thereof (e.g., silicon nitride over silicon oxide).

The bumping metal in layer 520 is conventional, and may comprise one or more materials conventionally used to interface (or provide a reliable electrical connection) between bump pad sections 510-512 and ball bond 550. Thus, bumping metal 520 may comprise a lower adhesive layer (e.g., titanium [Ti], tantalum [Ta], silicon [Si] or aluminum [Al]), and an outermost barrier layer (e.g., of titanium nitride [TiN], tantalum nitride [TaN], tungsten nitride [WN], or an alloy of titanium-tungsten [TiW] or nickel-vanadium [NiV]) and/or ball bond adhesion promoter (e.g., nickel [Ni], copper [Cu] or Cu alloy, silver [Ag] or gold [Au]). However, as can be seen in FIG. 5B, bumping metal layer 520 electrically connects the various bump pad sections (e.g., first and second bump pad sections 510 and 512 in FIG. 5B, and first through fourth bump pad sections 502, 504, 506 and 508 in FIG. 5A) to each other, thereby enabling transmission of a single external signal (or a single power supply, reference voltage or reference signal such as a clock) to multiple input or input/output circuits or circuit blocks.

Ball bond 550 is also conventional, and may contain, for example, a conventional lead-free solder material (e.g., a tin [Sb]-silver [Ag]-copper [Cu] alloy containing from 90 to 98% Sb, 1.8 to 8% Ag, and from 0.2-2% Cu (percentages being by weight, volume or moles/atoms).

FIG. 5C shows a cross-sectional view of the bump pad region 500 of FIG. 5A along the B-B' axis, further comprising ball bond 550 thereon. Bump pad/ball bond region 500" (FIG. 5C) shows insulation layer 530, bumping metal layer 520, and ball bond 550. In this case, insulation layer 530 contains second and third disconnections 542 and 544, electrically isolating first bump pad section 502 from fourth bump pad section 508 (see FIG. 5A) and second bump pad section 504 from third bump pad section 506, respectively.

An Exemplary Method of Making the Structure

The present invention further relates to method of manufacturing a structure, comprising the steps of (a) forming, from an uppermost metal layer on a device, a bump pad, a plurality of bond pads, each configured for independent electrical connection to the bump pad, and a plurality of conductive traces, each trace adapted to electrically connect one of the bond pads to the bump pad; and (b) forming an insulation (or, preferably, a passivation) layer over the uppermost metal layer. In one embodiment, the bump pad comprises a plurality of electrically disconnected bump pad sections. Alternatively (and as will be discussed in greater detail below), each of the plurality of conductive traces may comprise a plurality of trace sections having an electrical disconnection therebetween. In general, however, the insulation layer is a passivation layer, which generally refers to an uppermost insulation layer (or non-conductive layer providing a sealant, or waterproofing and/or oxygen exposure-preventing function).

FIGS. 6A-6E show cross-sectional views of an exemplary structure during various stages of an exemplary manufacturing method in which a ball bond packaging option (e.g., BGA, FPBGA) is selected. Generally, the cross-sectional views show a cross-section of the structure 500' in FIG. 5B (i.e., the structure 500 in FIG. 5A, taken along the A-A' axis). However, FIGS. 6A-C focus on the method of manufacturing (or making) a structure having a plurality of available packaging options.

Figure 6A:
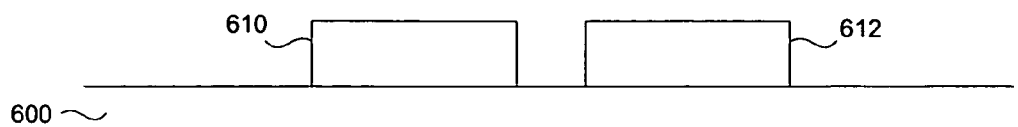
FIGS. 6A-6E show cross-sectional views of an IC during various stages of manufacturing the bump pad of FIG. 5A.

Referring now to FIG. 6A, first and second bump pad sections 610 and 612 may be formed by depositing, then photolithographically patterning and etching, a layer of metal on substrate 600. Substrate 600 generally comprises an outer (or exposed) insulator layer, under which or adjacent to which may be located active circuit components, such as busses, conductive (metal) traces, resistors, fuses, etc., in addition to input/output and/or protective circuitry as explained above. As shown in FIG. 6A, the metal may comprise aluminum and may be deposited by sputtering. Alternatively, first and second bump pad sections 610 and 612 may be formed by damascene metal formation (e.g., patterning and etching an upper insulator layer in substrate 600), in which case the bulk metal may comprise copper (and the structure will not appear identical to that shown in FIG. 6A).

Figure 6B:
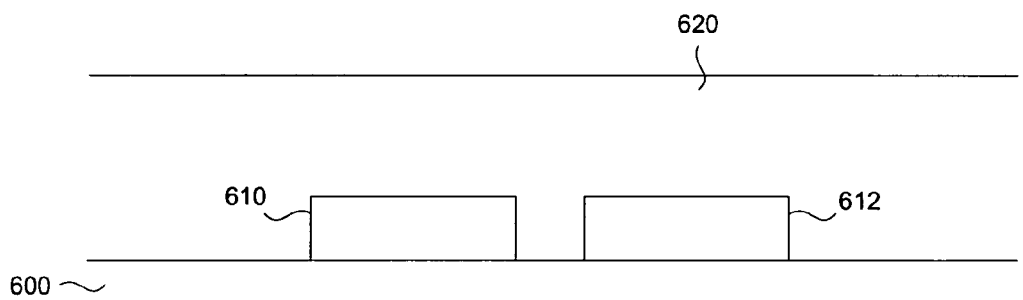

As shown in FIG. 6B, an insulator or passivation layer 620 (as described above for insulator layer 530) is deposited onto the structure in FIG. 6A (generally by chemical vapor deposition [CVD], which may also comprise plasma-enhanced CVD or high density plasma CVD). After deposition, the passivation layer 620 may be planarized (e.g., by polishing or CMP, reflow, etchback, etc.). At this point, the manufacturer still has all possible packaging options available, since no openings have been formed in the passivation layer 620. Also, after formation of the passivation layer 620, most (or all) conventional wafer manufacturing flows may be considered complete. Subsequent openings made in passivation layer 620 may be considered a first step in the packaging process.

Figure 6C:
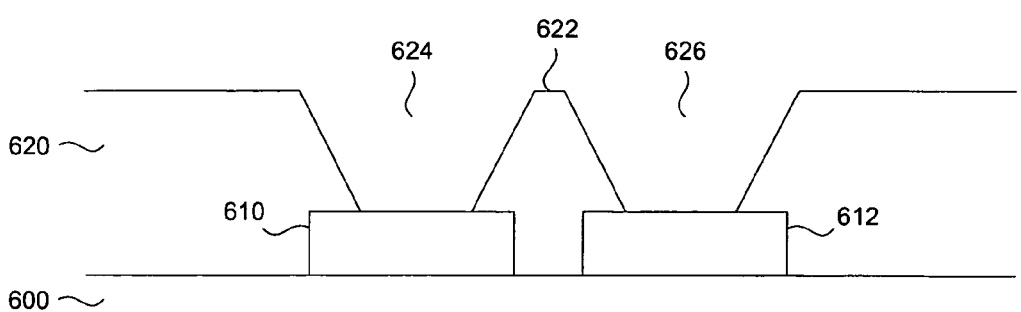

Then, as shown in FIG. 6C, openings 624 and 626 are formed in passivation layer 620, generally by conventional photolithography and etching. In the embodiment of FIG. 6C, openings 624 and 626 generally leave disconnection portion 622 in place (e.g., between first and second bump pad sections 610 and 612). In addition, openings 624 and 626 generally expose those bump pad sections to be electrically connected to each other and to corresponding bond pad sections (not shown). The slope of the sidewalls of openings 624 and 626 may be slightly exaggerated in the case of FIG. 6C. In many cases, the slope may be more perpendicular to the plane of first and second bump pad sections 610 and 612 (e.g., closer to the range of 80-87°). However, in most commercial applications, the slope of the sidewalls of the bump pad openings (e.g., 624 and 626) should be less than 90°, to provide a somewhat concave "cup" in which parts (or all) of a subsequent solder ball or solder bump may fit relatively securely.

At this point, the present method of making a structure having multiple packaging options is substantially complete. From this point forward, the method of making is directed more towards making an IC having one of a plurality of packaging options. In general, one selects a packaging option by forming either (i) a wire bond to at least one of the bond pads, or (ii) a solder bump or solder ball on or over the bump pad.

Figure 6D:
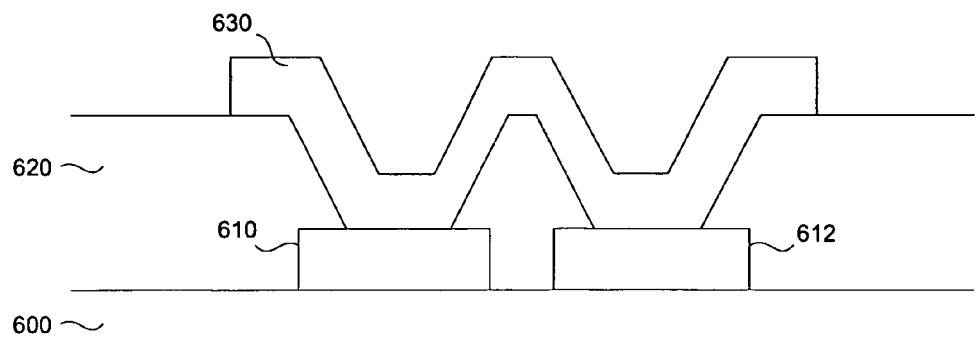

Referring now to FIG. 6D, bumping metal layer 630 is formed by conventionally depositing one or more bumping metal layers (generally by sputtering, CVD or ion metal plasma [IMP]-assisted deposition), then photolithographically patterning and etching the bumping metal layer(s). As shown in the embodiment of FIG. 6D, bumping metal layer 630 connects those bump pad sections (e.g., 610 and 612) exposed by openings (e.g., 624 and 626 in FIG. 6C) in passivation layer 620.

Figure 6E:
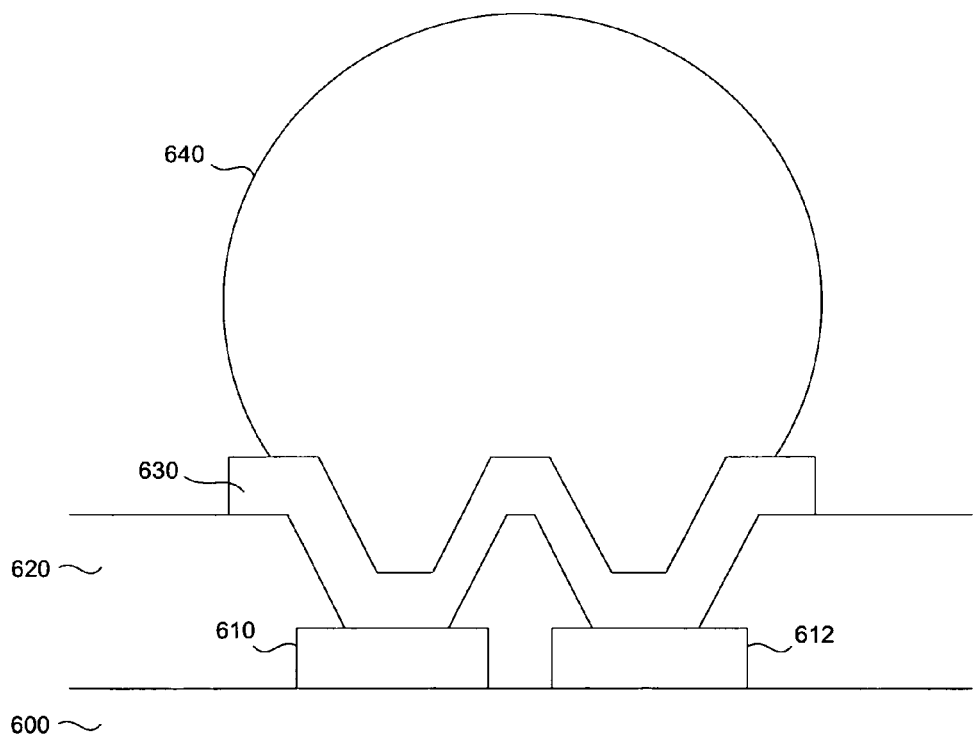

Finally, FIG. 6E shows the structure having a ball bond 640 conventionally attached thereto. As shown in FIG. 6E, ball bond 640 has a contact area with bumping metal layer 630 that is smaller than the exposed surface area of bumping metal layer 630, contributing to the concave "cup" configuration in which parts of solder ball/solder bump 640 fit securely. Thus, the present method may further comprise (i) electrically connecting one or more of the plurality of bond pads to the bump pad, and/or (ii) forming a solder bump or solder ball on or over the bump pad.

As mentioned above, one may also select a wire bond packaging option (e.g., a quad flat pack, multi-chip module, etc.) prior to forming openings in the passivation layer 630. Thus, in the present method of making a semiconductor device or IC having one of a plurality of packaging options, one may form an opening over either the plurality of bond pads or the bump pad before the step of electrically connecting the bump pad to the bond pads. To select a wire bond packaging option, one forms openings in the passivation layer 630 over at least one of the plurality of bond pads, then forms a wire bond to each of the exposed bond pads (e.g., between a bond pad and a corresponding lead of a lead frame). In many cases, openings will be formed to at least two of the plurality of bond pads, and in some cases, to all of the bond pads adapted to be electrically connected to the bump pad.

A Second Exemplary Structure, Architecture and/or Layout

Figure 7:
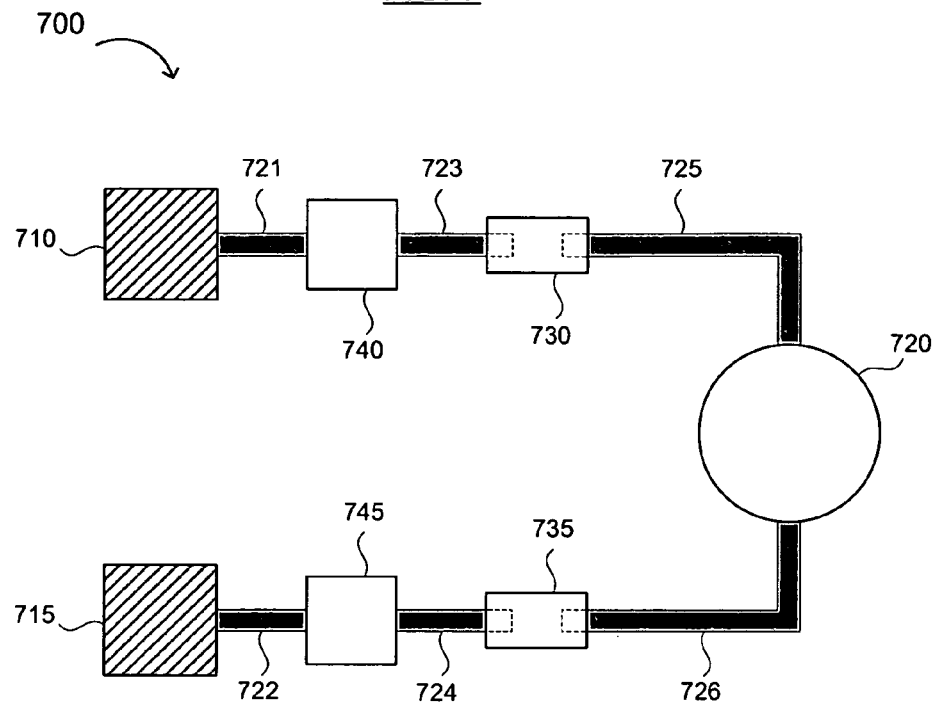
FIG. 7 is a diagram showing a top-down view of a third embodiment of the present invention.

FIG. 7 shows a second embodiment of the present structure, in which the disconnection is located in the conductive trace between the bond pad and the bump pad, rather than in the bump pad. In such a case, the semiconductor manufacturer or IC designer selects a ball bond packaging option by electrically connecting the disconnected portions of the conductive trace by forming an opening over the electrical disconnection sufficient to expose disconnected portions of the conductive trace, and depositing the bumping metal layer into the opening(s) such that an electrical connection is formed between the disconnected portions of the conductive trace. Thus, each of the conductive traces may comprise a plurality of (electrically disconnected) trace sections having a disconnection therebetween, and the structure may further comprise, for each of the plurality of conductive traces configured to electrically connect a bump pad to one or more of a plurality of bond pads, a bumping metal layer electrically connecting the plurality of trace sections to each other.

FIG. 7 shows a top-down (layout) view of an exemplary structure 700 according to the present invention, comprising bond pads 710 and 715, bump pad 720, disconnection 730 in or between conductive trace sections 723 and 725, and disconnection 735 in or between conductive trace sections 724 and 726. Structure 700 may further contain input/output (I/O) circuits (each of which may include one or more protective devices) 740 and 745. Conductive trace section 721 may electrically connect bond pad 710 and I/O circuit 740, and conductive trace section 722 may electrically connect bond pad 715 and I/O circuit 745.

As described above, a ball bond option may be selected by forming an electrical connection by depositing a bumping metal layer in an opening in the passivation layer, over disconnections 730 and 735, respectively connecting ends of trace sections 723 and 725, and ends of trace sections 724 and 726. At the same time, the bumping metal layer is also deposited in an opening in the passivation layer over bump pad 720, as in conventional ball bond packaging technology. In this embodiment, bump pad 720 does not necessarily comprise a plurality of sections, nor does bump pad 720 necessarily contain an electrical disconnection.

The disconnection (e.g., 730 or 735) may have a location anywhere along the conductive trace between the I/O circuit (e.g., 740 or 745) and bump pad 720. However, for purposes of minimizing electrical effects of trace sections 723 and 724 (e.g., on actual or parasitic resistance and/or capacitance on neighboring or adjacent traces), disconnections 730 and 735 may have a location proximate to I/O circuits 740 and 745 (relative to bump pad 720).

Alternatively, the semiconductor or IC manufacturer and/or designer may select a wire bond packaging option by electrically connecting a wire bond to one of the bond pads having one of the plurality of conductive traces electrically connected thereto. In such a case, the conductive trace retains the electrical disconnection therein (between the plurality of trace sections), and does not further contain a bumping metal layer electrically connecting the plurality of trace sections to each other. In other words, openings are not formed over the disconnection, and a bumping metal layer is not deposited therein.

Figure 8:
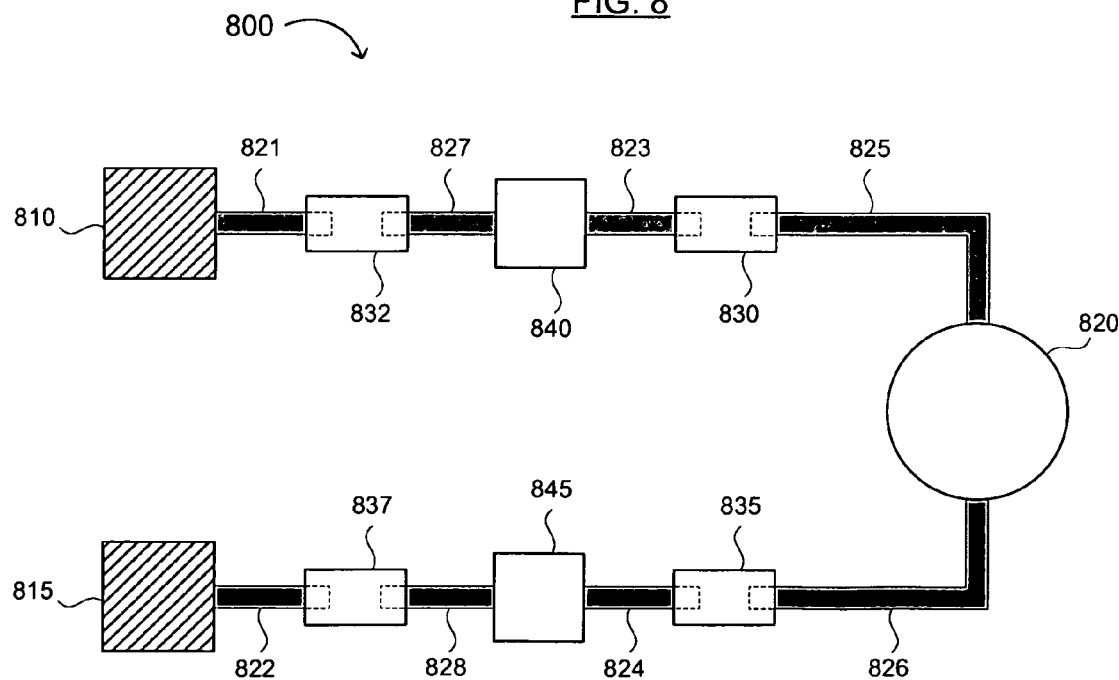
FIG. 8 is a diagram showing a top-down view of a fourth embodiment of the present invention.

FIG. 8 shows a top-down (layout) view of another exemplary structure 800 according to the present invention, comprising bond pads 810 and 815, bump pad 820, disconnection 830 in or between conductive trace sections 823 and 825, disconnection 832 in or between conductive trace sections 821 and 827, disconnection 835 in or between conductive trace sections 824 and 826, and disconnection 837 in or between conductive trace sections 822 and 828. Structure 800 may further contain input/output (I/O) circuits (each of which may include one or more protective devices) 840 and 845. Conductive trace sections 821 and 827 may electrically connect bond pad 810 and I/O circuit 840, and conductive trace sections 822 and 828 may electrically connect bond pad 815 and I/O circuit 845.

Structure 800 is essentially the same as structure 700 of FIG. 7, except for disconnections 832 and 837, respectively disconnecting bond pads 810 and 815 from I/O circuitry 840 and 845. In certain applications, one may wish to electrically disconnect the bond pad (and corresponding trace section connected thereto; e.g., 821 or 822) to minimize electrical effects of the bond pad and trace section (e.g., actual resistance, capacitance and/or inductance, parasitic capacitance, etc.). In such a case, disconnections 832 and 837 may have a location proximate to I/O circuits 840 and 845 (relative to bond pads 810 and 815, respectively).

An Exemplary Integrated Circuit

In a further embodiment, the present invention relates to an integrated circuit or semiconductor device, comprising (a) the present structure (largely as described above); and (b) a substrate physically supporting the structure. Such an integrated circuit or semiconductor device may further comprise a plurality of integrated circuit components or semiconductor devices thereon. In addition, the integrated circuit or semiconductor device may further comprise a packaging material (e.g., a packaging substrate, which may comprise a lead frame when a wire bond packaging option is selected or a conventional ball bonding substrate when a ball bonding packaging option is selected, and a conventional epoxy material to encapsulate the IC) surrounding the substrate and the structure.

Exemplary Software

The present invention also includes algorithms, computer program(s) and/or software, implementable and/or executable in a general purpose computer or workstation equipped with a conventional (digital) signal processor or other processing device, configured to (a) place a bump pad and a plurality of bond pads in an upper metal layer, each such bond pad configured for independent electrical connection to the bump pad; and (b) route a plurality of conductive traces in the upper metal layer, each trace adapted to electrically connect one of the bond pads to the bump pad. Thus, a further aspect of the invention relates to algorithms and/or software that implement the above design(s) and/or layout(s). For example, the invention may further relate to a computer program, computer-readable medium or waveform containing a set of instructions which, when executed by an appropriate processing device (e.g., a signal processing device, such as a microcontroller, microprocessor or DSP device), is configured to place IC devices and/or structures and route signal paths therebetween, as such structures and signal paths are generally described herein.

For example, the computer program may be on any kind of readable medium, and the computer-readable medium may comprise any medium that can be read by a processing device configured to read the medium and execute code stored thereon or therein, such as a floppy disk, CD-ROM, magnetic tape or hard disk drive. Such code may comprise object code, source code and/or binary code.

The waveform is generally configured for transmission through an appropriate medium, such as copper wire, a conventional twisted pair wireline, a conventional network cable, a conventional optical data transmission cable, or even air or a vacuum (e.g., outer space) for wireless signal transmissions. The waveform and/or code for implementing the present method(s) are generally digital, and are generally configured for processing by a conventional digital data processor (e.g., a microprocessor, microcontroller, or logic circuit such as a programmable gate array, programmable logic circuit/device or application-specific [integrated] circuit).

In various embodiments, the computer-readable medium or waveform comprises at least one instruction to (i) place bump pad sections in a bump pad region of the layout such that a disconnection results between any two adjacent bump pad sections; or (ii) route a conductive trace between a bump pad and each of a plurality of bond pads such that each conductive trace has a disconnection therein. The set of instructions may also further comprise at least one instruction to (i) place the disconnection in a conductive trace proximate to an input/output circuit, relative to the bump pad; and/or (ii) place a second disconnection in a conductive trace proximate to an input/output circuit, relative to the bond pad.

An Exemplary Method of Selecting an IC Packaging Option

In a further aspect, the present invention relates to a method of selecting a packaging option, comprising the steps of (a) forming, from an uppermost metal layer on a device, a bump pad, a plurality of bond pads (each configured for independent electrical connection to the bump pad), and a plurality of conductive traces, each trace adapted to electrically connect one of the bond pads to the bump pad; and (b) forming either (i) a wire bond to at least one of the bond pads, or (ii) a bumping metal configured to electrically connect at least one of the bond pads to the bump pad. Thus, there is overlap between the methods of manufacturing a device having multiple packaging options available for selection, as described above.

In one embodiment, the bump pad comprises a plurality of electrically disconnected bump pad sections, and one may select a ball bond packaging option by depositing a bumping metal onto one or more of the plurality of bump pad sections. In most cases, the bumping metal is deposited onto two or more (or all) of the plurality of bump pad sections. In an alternative embodiment, each of the plurality of conductive traces may comprise a plurality of trace sections having an electrical disconnection therebetween, in which case one may select a ball bond packaging option by depositing a bumping metal layer configured to electrically connect at least two of the plurality of trace sections (to each other) in one or more, two or more, or all of the conductive traces.

To select a wire bond packaging option, forming step (b) simply comprises forming a wire bond to at least one of the bond pads, Optionally, the method may form a wire bond to at least two of the bond pads, or to each of the bond pads in the plurality of bond pads. To select a ball bond packaging option, forming step (b) generally comprises forming (e.g., by depositing) a bumping metal layer that electrically connects at least one of the bond pads to the bump pad. Optionally, the method may electrically connect at least two of the bond pads, or to each of the bond pads in the plurality of bond pads, to the bump pad.

In one embodiment where the ball bond option is selected, the bump pad comprises a plurality of electrically disconnected bump pad sections, and the forming step (b) comprises depositing a bumping metal onto the plurality of bump pad sections. Alternatively, each of the plurality of conductive traces may comprise a plurality of trace sections having an electrical disconnection therebetween, and the forming step (b) comprises depositing a bumping metal layer configured to electrically connect at least two of the plurality of trace sections. In most cases, the method generally further comprises forming an opening over either the plurality of bond pads or the bump pad before the forming step, depending on which packaging option is selected.

Exemplary Systems Including the Packaged IC

Figure 9A:
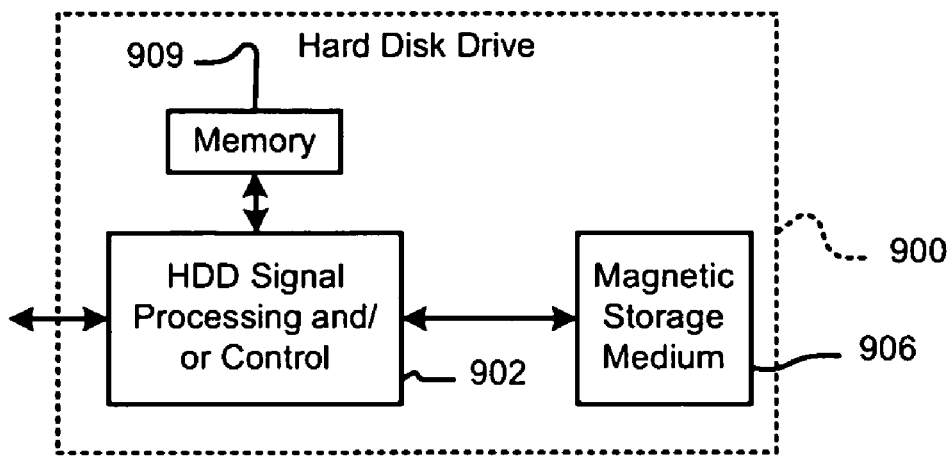
FIGS. 9A-9G show various exemplary implementations of systems including ICs packaged according to the present invention.

The present packaged IC can be implemented in various exemplary systems, as described herein. Referring now to FIG. 9A, for example, the present invention can be implemented as part of a hard disk drive 900 (or control unit therefor). The present invention may further contain signal processing and/or control circuits, generally identified in FIG. 9A at 402. In some implementations, the signal processing and/or control circuit 902 and/or other circuits in the HDD 900 may process data, perform coding and/or encryption, perform calculations, and/or format data that is output to and/or received from a magnetic storage medium 906.

The HDD 900 may communicate with a host device (not shown) such as a computer, mobile computing devices such as personal digital assistants, cellular phones, media or MP3 players and the like, and/or other devices via one or more wired or wireless communication links 908. The HDD 900 may be connected to memory 909 such as random access memory (RAM), low latency nonvolatile memory such as flash memory, read only memory (ROM) and/or other suitable electronic data storage.

Figure 9B:
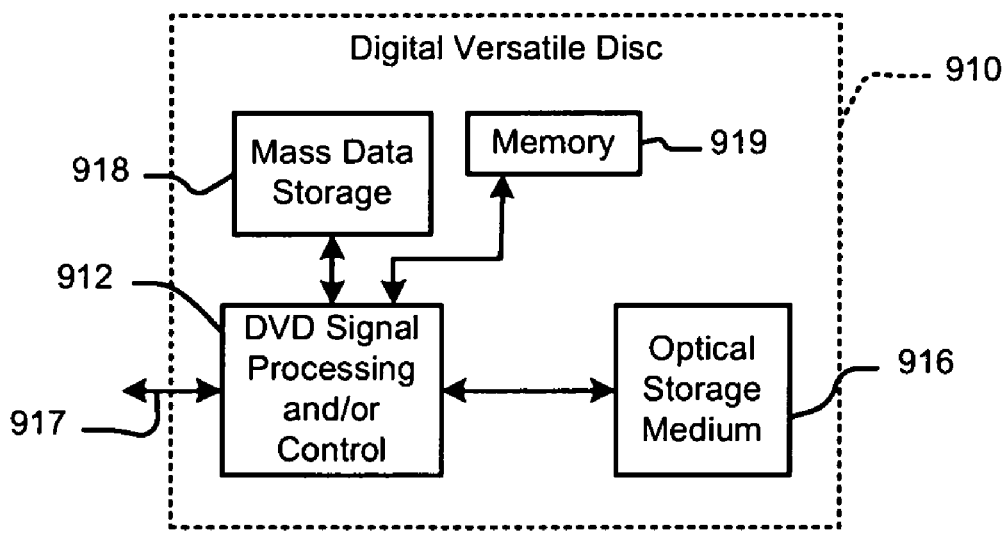

Referring now to FIG. 9B, the present invention can be implemented in a packaged IC for a digital versatile disc (DVD) drive 910. The present packaged IC may further include either or both signal processing and/or control circuits, which are generally identified in FIG. 9B at 912. The signal processing and/or control circuit 912 and/or other circuits (not shown) in the DVD may process data, perform coding and/or encryption, perform calculations, and/or format data that is read from and/or data written to an optical storage medium 916. In some implementations, the signal processing and/or control circuit 912 and/or other circuits (not shown) in the DVD 910 can also perform other functions such as encoding and/or decoding and/or any other signal processing functions associated with a DVD drive.

The DVD drive 910 may communicate with an output device (not shown) such as a computer, television or other device via one or more wired or wireless communication links 917. The DVD 910 may communicate with a mass data storage 918 that stores data in a nonvolatile manner. The mass data storage 918 may include a hard disk drive (HDD), such as the HDD 900 shown in FIG. 9A. The HDD may also be or comprise a mini HDD that includes one or more platters having a diameter that is smaller than approximately 1.8". The DVD may be connected to a memory 919 such as RAM, ROM, low latency nonvolatile memory such as flash memory and/or other suitable electronic data storage.

Figure 9C:
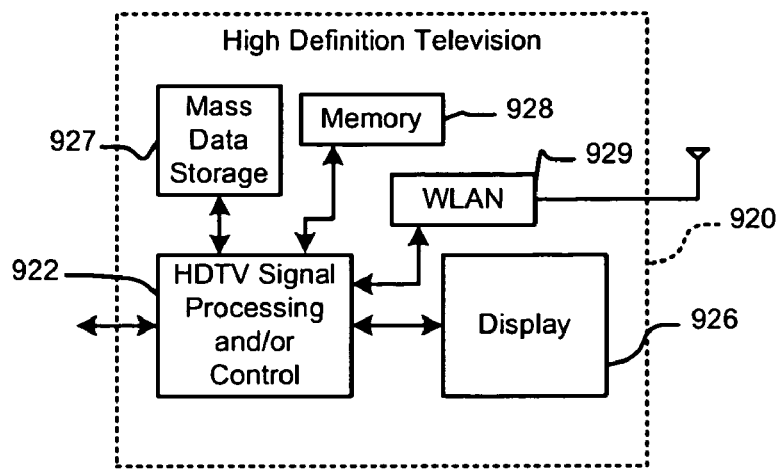

Referring now to FIG. 9C, the present invention can also be implemented in a packaged IC for a high definition television (HDTV) 920. The IC may include either or both signal processing and/or control circuits, which are generally identified in FIG. 9E at 922, a WLAN interface and/or mass data storage system of the HDTV 420. The HDTV 420 receives HDTV input signals in either a wired or wireless format and generates HDTV output signals for a display 926. In some implementations, signal processing circuit and/or control circuit 922 and/or other circuits (not shown) of the HDTV may process data, perform coding and/or encryption, perform calculations, format data and/or perform any other type of HDTV processing that may be required.

The HDTV 920 may communicate with a mass storage 927 that stores data in a nonvolatile manner, such as optical and/or magnetic storage devices. At least one such optical and/or magnetic storage device may comprise the HDD 900 and/or DVD 910 described above and shown in FIGS. 9A-9B, respectively. The HDD may be or comprise a mini HDD that includes one or more platters having a diameter that is smaller than approximately 1.8". The HDTV 920 may be connected to a memory 928 such as RAM, ROM, low latency nonvolatile memory such as flash memory and/or other suitable electronic data storage. The HDTV 920 also may support connections with a WLAN via a WLAN network interface 929.

Figure 9D:
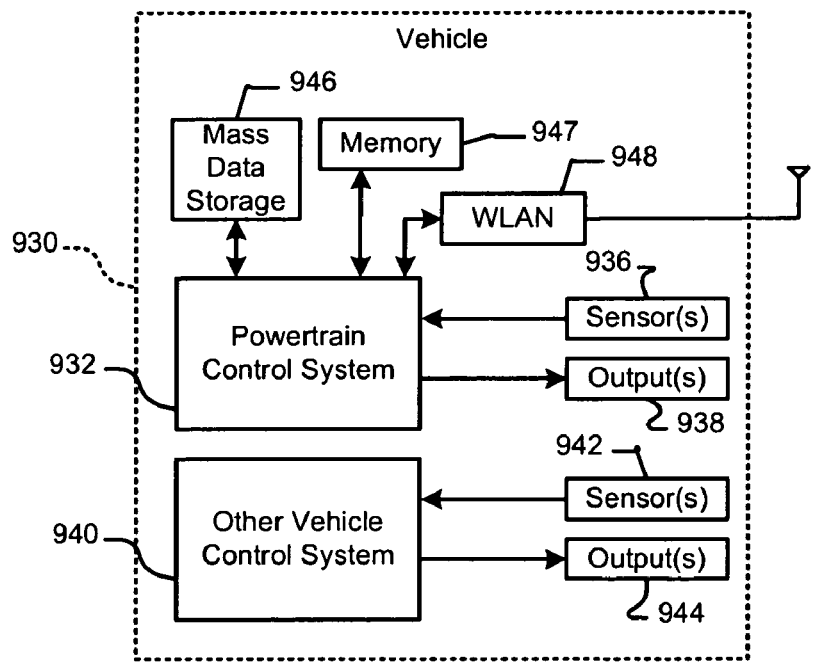

Referring now to FIG. 9D, the present invention can also be implemented in a packaged IC for a control system 930 of a vehicle, a WLAN interface and/or mass data storage system of the vehicle control system. In some implementations, the present invention is implemented in a powertrain control system 932 that receives inputs from one or more sensors 936 such as temperature sensors, pressure sensors, rotational sensors, airflow sensors and/or any other suitable sensors and/or that generates one or more one or more output control signals such as engine operating parameters, transmission operating parameters, and/or other control signals to output devices 938.

The present invention may also be implemented in other control systems 940 of the vehicle 930. The control system 940 may likewise receive signals from input sensors 942 and/or output control signals to one or more output devices 944. In some implementations, the control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 946 that stores data in a nonvolatile manner. The mass data storage 946 may include optical and/or magnetic storage devices (for example, hard disk drives [HDDs] and/or DVDs. At least one HDD may have the configuration shown in FIG. 9A and/or at least one DVD may have the configuration shown in FIG. 9B. The HDD may be or comprise a mini HDD that includes one or more platters having a diameter that is smaller than approximately 1.8". The powertrain control system 932 may be connected to memory 947 such as RAM, ROM, low latency nonvolatile memory such as flash memory and/or other suitable electronic data storage. The powertrain control system 932 also may support connections with a WLAN via a WLAN network interface 948. The control system 940 may also include mass data storage, memory and/or a WLAN interface (all not shown).

Figure 9E:
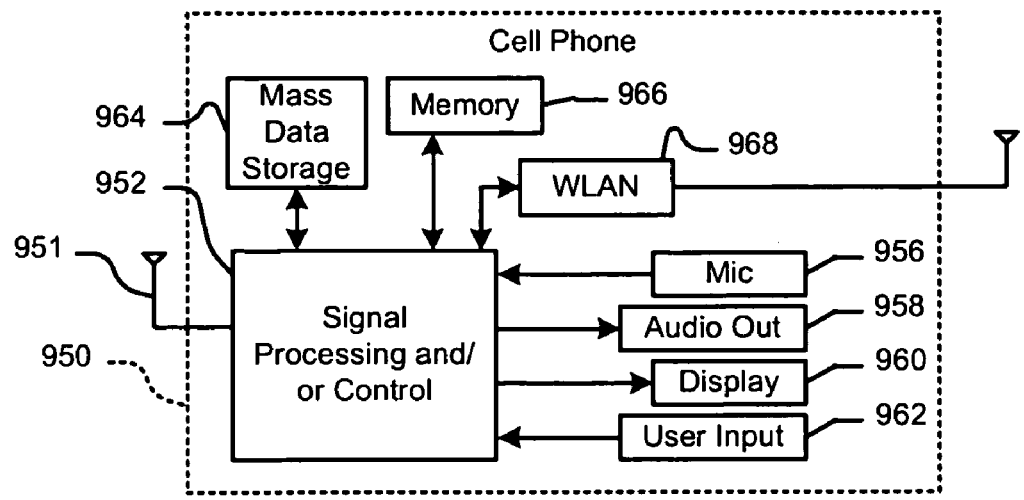

Referring now to FIG. 9E, the present invention can be implemented in a cellular phone 950 that may include a cellular antenna 951. The present invention may include either or both signal processing and/or control circuits, which are generally identified in FIG. 9E at 952, a WLAN interface and/or mass data storage of the cellular phone 950. In some implementations, the cellular phone 950 includes a microphone 956, an audio output 958 such as a speaker and/or audio output jack, a display 960 and/or an input device 962 such as a keypad, pointing device, voice actuation and/or other input device. The signal processing and/or control circuits 952 and/or other circuits (not shown) in the cellular phone 950 may process data, perform coding and/or encryption, perform calculations, format data and/or perform other cellular phone functions.

The cellular phone 950 may communicate with mass data storage 964 that stores data in a nonvolatile manner, such as optical and/or magnetic storage devices (for example, hard disk drives [HDDs] and/or DVDs). At least one HDD may have the configuration shown in FIG. 9A and/or at least one DVD may have the configuration shown in FIG. 9B. The HDD may be a mini HDD that includes one or more platters having a diameter that is smaller than approximately 1.8". The cellular phone 950 may include or be connected to memory 966 such as RAM, ROM, low latency nonvolatile memory such as flash memory and/or other suitable electronic data storage. The cellular phone 950 also may support connections with a WLAN via a WLAN network interface 968.

Figure 9F:
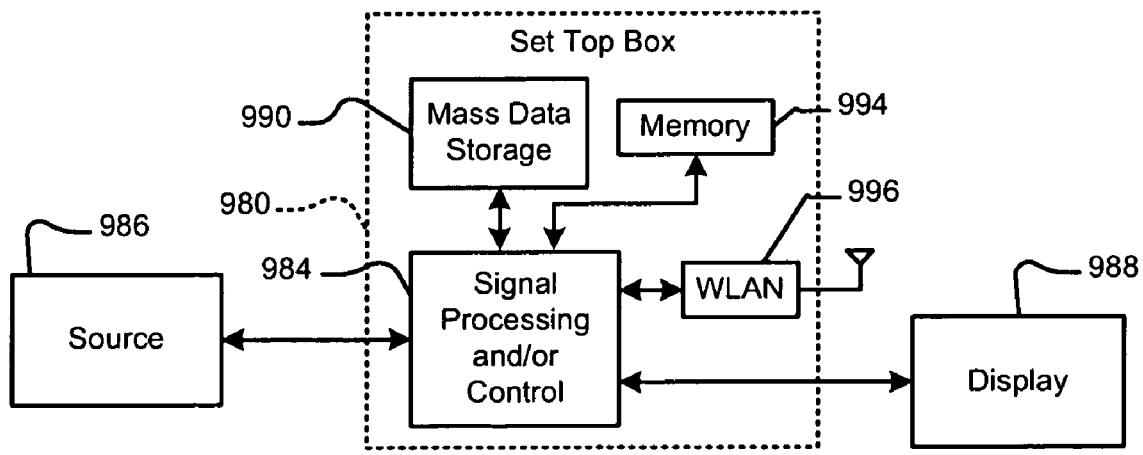

Referring now to FIG. 9F, the present invention can be implemented in an IC for a set top box 980. The present invention may include either or both signal processing and/or control circuits, which are generally identified in FIG. 9F at 984, a WLAN interface 996 and/or mass data storage 990 of the set top box 980. The set top box 980 receives signals from a source 986 (such as a broadband source) and outputs standard and/or high definition audio/video signals suitable for a display 988 (such as a television and/or monitor and/or other video and/or audio output devices). The signal processing and/or control circuits 984 and/or other circuits (not shown) of the set top box 980 may process data, perform coding and/or encryption, perform calculations, format data and/or perform any other set top box function.

The set top box 980 may communicate with mass data storage 990 that stores data in a nonvolatile manner. The mass data storage 990 may include optical and/or magnetic storage devices (for example, hard disk drives [HDDs] and/or DVDs). At least one HDD may have the configuration shown in FIG. 9A and/or at least one DVD may have the configuration shown in FIG. 9B. The HDD may be a mini HDD that includes one or more platters having a diameter that is smaller than approximately 1.8". The set top box 980 may be connected to memory 994 such as RAM, ROM, low latency nonvolatile memory such as flash memory and/or other suitable electronic data storage. The set top box 980 also may support connections with a WLAN via a WLAN network interface 996.

Figure 9G:
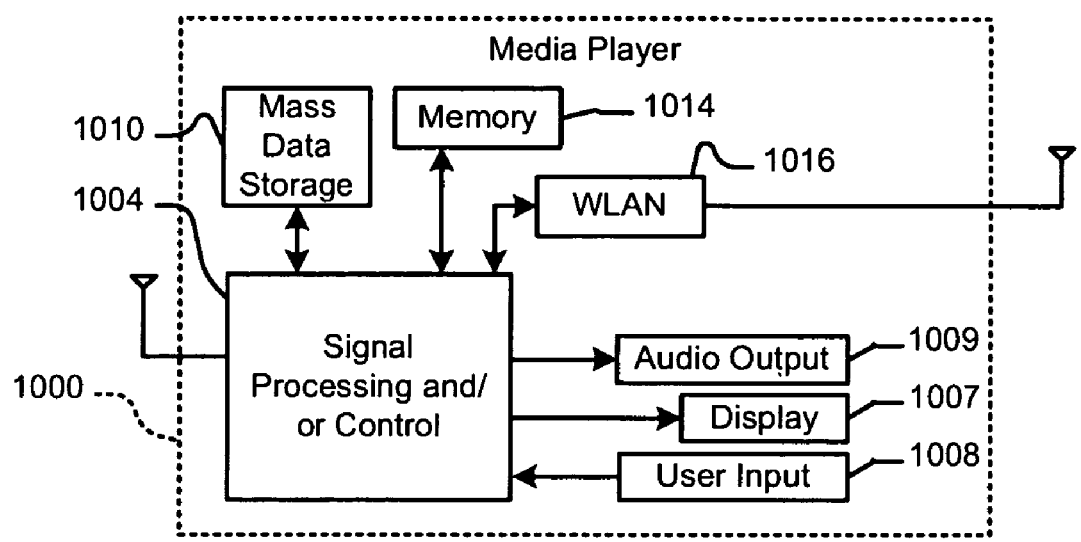

Referring now to FIG. 9G, the present invention can be implemented in a packaged IC for a media player 1000. The present invention may implement either or both signal processing and/or control circuits, which are generally identified in FIG. 9G at 1004, a WLAN interface 1016 and/or mass data storage 1010 of the media player 1000. In some implementations, the media player 1000 includes a display 1007 and/or a user input 1008 such as a keypad, touchpad and the like. In some implementations, the media player 1000 may employ a graphical user interface (GUI) that typically employs menus, drop down menus, icons and/or a point-and-click interface via the display 1007 and/or user input 1008. The media player 1000 further includes an audio output 1009 such as a speaker and/or audio output jack. The signal processing and/or control circuits 1004 and/or other circuits (not shown) of the media player 1000 may process data, perform coding and/or encryption, perform calculations, format data and/or perform any other media player function.

The media player 1000 may communicate with mass data storage 1010 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVDs). At least one HDD may have the configuration shown in FIG. 9A and/or at least one DVD may have the configuration shown in FIG. 9B. The HDD may be a mini HDD that includes one or more platters having a diameter that is smaller than approximately 1.8". The media player 1000 may be connected to memory 1014 such as RAM, ROM, low latency nonvolatile memory such as flash memory and/or other suitable electronic data storage. The media player 1000 also may support connections with a WLAN via a WLAN network interface 1016. Still other implementations in addition to those described above are contemplated.

CONCLUSION/SUMMARY

Thus, the present invention provides a structure, methods and software for configuring an integrated circuit for multiple packaging types and/or selecting one of a plurality of packaging types for an integrated circuit. The structure generally comprises (a) a bump pad; (b) a plurality of bond pads, each configured for independent electrical connection to the bump pad; and (c) a plurality of conductive traces, each trace adapted to electrically connect one of the bond pads to the bump pad. The software (which may also relate to an algorithm and/or computer program) generally comprises a set of executable instructions configured to (a) place a bump pad and a plurality of bond pads in an upper metal layer, each such bond pad configured for independent electrical connection to the bump pad, and (b) route a plurality of conductive traces in the upper metal layer, each trace adapted to electrically connect one of the bond pads to the bump pad, and/or otherwise implement one of the present methods or execute any process or sequence of steps embodying the inventive concepts described herein. The invention also encompasses architectures and/or systems generally comprise those that include a structure, circuit or layout embodying one or more of the inventive concepts disclosed herein.

The method of manufacturing or making the structure generally comprises (1) forming, from an uppermost metal layer on a device, a bump pad, a plurality of bond pads, and a plurality of conductive traces, each bond pad configured for independent electrical connection to the bump pad, and each trace adapted to electrically connect one of the bond pads to the bump pad; and (2) forming an insulation layer over the uppermost metal layer. The method of selecting a packaging option generally comprises the steps of (I) forming, from an uppermost metal layer on a device, a bump pad, a plurality of bond pads each configured for independent electrical connection to the bump pad, and a plurality of conductive traces each trace adapted to electrically connect one of the bond pads to the bump pad; and (II) forming either (i) a wire bond to at least one of the bond pads, or (ii) a bumping metal configured to electrically connect at least one of the bond pads to the bump pad.

The present invention advantageously provides reduced manufacturing costs by using a common mask for the level of metal (typically the uppermost such level) forming pads in various packaging options. The present invention also reduces inventory management issues by enabling one device to be manufactured at a wafer level for a plurality of different packaging options, thereby enabling packaging decisions to be made at a later time in the manufacturing process (e.g., immediately prior to packaging). Thus, the present invention provides significant and/or commercially important benefits to integrated circuit designers, manufacturers, and sellers/distributors.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A structure, comprising:
a plurality of input/output circuits;
a bump pad in electrical communication with said plurality of input/output circuits;
a plurality of bond pads, each in electrical communication with a unique one of said plurality of input/output circuits and configured for independent electrical connection to said bump pad;
a plurality of conductive traces, each trace in electrical communication with a unique one of said plurality of input/output circuits and adapted to electrically connect one of said bond pads to said bump pad and wherein said plurality of input/output circuits are in closer proximity to said bond pads than to said bump pad.

2. The structure of claim 1, further comprising a disconnection in said bump pad and/or each of said plurality of conductive traces.

3. The structure of claim 2, wherein said bump pad comprises a plurality of bump pad sections, said disconnection being between at least two of said bump pad sections.

4. The structure of claim 3, further comprising a bumping metal layer on or over said bump pad.

5. The structure of claim 4, further comprising a solder bump or solder ball on or over said bumping metal layer.

6. The structure of claim 4, wherein said bumping metal comprises a lower adhesive layer and an outermost barrier layer and/or ball bond adhesion promoter.

7. The structure of claim 6, wherein said bumping metal comprises said lower adhesive layer, said outermost barrier layer and said ball bond adhesion promoter.

8. The structure of claim 7, wherein said lower adhesive layer comprises titanium, tantalum, silicon or aluminum.

9. The structure of claim 7, wherein said outermost barrier layer comprises titanium nitride, tantalum nitride, tungsten nitride, or an alloy of titanium-tungsten or nickel-vanadium.

10. The structure of claim 7, wherein said ball bond adhesion promoter comprises nickel, copper or copper alloy, silver or gold.

11. The structure of claim 1, further comprising a plurality of circuit protection devices, wherein each of said plurality of bond pads is in electrical communication with at least one of said circuit protection devices.

12. An integrated circuit or semiconductor device, comprising:
the structure of claim 1; and
a substrate physically supporting said structure.

13. The integrated circuit or semiconductor device of claim 12, further comprising a plurality of integrated circuit components or semiconductor devices thereon.

14. The integrated circuit or semiconductor device of claim 12, further comprising a packaging material surrounding said substrate and said structure.

15. The structure of claim 12, wherein said plurality of input/output circuits are configured as input and/or input/output buffers.

16. The structure of claim 1, wherein each of said plurality of bond pads is configured for physical connection to a wire bond.

17. The structure of claim 16, wherein each of said plurality of bond pads does not have a wire bond attached thereto.

18. The structure of claim 16, wherein said bump pad does not have a ball bond attached thereto.

19. The structure of claim 1, further comprising a wire bond to each of at least one of said plurality of bond pads.

20. The structure of claim 19, comprising a unique wire bond to each of said plurality of bond pads.

21. The structure of claim 1, wherein said plurality of input/output circuits comprise a plurality of circuit protection devices, wherein said bump pad and each of said plurality of bond pads is in electrical communication with said circuit protection devices.

22. The structure of claim 1, further comprising a plurality of circuit protection devices, wherein said bump pad and each of said plurality of bond pads is in electrical communication with at least one of said circuit protection devices.

23. The structure of claim 1, wherein one of said circuit protection devices is in electrical communication with more than one of said bond pads.

24. The structure of claim 1, wherein each of said plurality of input/output circuits provide an input signal to internal devices and/or circuitry of the integrated circuit.

25. A structure, comprising:
a plurality of input/output circuits;
means for attaching a solder bump or solder ball, said means for attaching said solder bump or said solder ball being in electrical communication with said plurality of input/output circuits;
a plurality of means for attaching a wire bond, each means for attaching said wire bond being in electrical communication with a unique one of said plurality of input/output circuits and configured for independent electrical connection to said means for attaching said solder bump or said solder ball; and
a plurality of means for electrically connecting one of said a plurality of means for attaching a wire bond to said means for attaching a solder bump or solder ball and wherein said plurality of input/output circuits are in closer proximity to said means for attaching the wire bond than to said means for attaching the solder bump or solder ball.

26. The structure of claim 25, further comprising a disconnection in said bump pad and/or each of said plurality of conductive traces.

27. The structure of claim 26, wherein said bump pad comprises a plurality of bump pad sections, said disconnection being between at least two of said bump pad sections.

28. The structure of claim 27, further comprising a bumping metal layer on or over said bump pad.

29. The structure of claim 28, further comprising a solder bump or solder ball on or over said bumping metal layer.

30. The structure of claim 26, further comprising a wire bond to each of at least one of said plurality of bond pads.

31. The structure of claim 30, comprising a unique wire bond to each of said plurality of bond pads.

* * * * *